(12) United States Patent
Hong et al.

(10) Patent No.: US 11,697,587 B2
(45) Date of Patent: Jul. 11, 2023

(54) BONE-CONDUCTION SENSOR ASSEMBLY

(71) Applicant: AAC ACOUSTIC TECHNOLOGIES (SHENZHEN) CO., LTD., Shenzhen (CN)

(72) Inventors: Tingting Hong, Shenzhen (CN); Zhenkui Meng, Shenzhen (CN); Kai Wang, Shenzhen (CN)

(73) Assignee: AAC Acoustic Technologies (Shenzhen) Co., Ltd., Shenzhen (CN)

( * ) Notice: Subject to any disclaimer, the term of this patent is extended or adjusted under 35 U.S.C. 154(b) by 73 days.

(21) Appl. No.: 17/541,290

(22) Filed: Dec. 3, 2021

(65) Prior Publication Data
US 2022/0402753 A1 Dec. 22, 2022

(30) Foreign Application Priority Data
Jun. 22, 2021 (CN) .......................... 202121397225.7

(51) Int. Cl.
*H04R 25/00* (2006.01)
*B81B 7/02* (2006.01)
*B81B 3/00* (2006.01)

(52) U.S. Cl.
CPC .............. *B81B 7/02* (2013.01); *B81B 3/0027* (2013.01); *H04R 25/00* (2013.01); *H04R 25/606* (2013.01); *B81B 2201/0285* (2013.01)

(58) Field of Classification Search
CPC . B81B 7/02; B81B 3/0027; B81B 2201/0285; H04R 25/606
See application file for complete search history.

(56) References Cited

U.S. PATENT DOCUMENTS

| | | | |
|---|---|---|---|
| 9,661,411 B1* | 5/2017 | Han | H04R 31/006 |
| 9,949,035 B2* | 4/2018 | Rucker | H04R 17/00 |
| 11,297,406 B2* | 4/2022 | Chandrasekaran | H04R 19/04 |
| 2005/0020873 A1* | 1/2005 | Berrang | H04R 25/606 600/25 |
| 2010/0242603 A1* | 9/2010 | Miller | B81B 7/02 29/830 |
| 2010/0322451 A1* | 12/2010 | Wu | H04R 19/005 381/369 |
| 2015/0181338 A1* | 6/2015 | Hosoi | H04R 1/02 381/309 |
| 2018/0151796 A1* | 5/2018 | Akahane | H01L 25/04 |
| 2018/0162723 A1* | 6/2018 | Degawa | G01D 21/02 |
| 2020/0255284 A1* | 8/2020 | Kueffner | H04R 19/005 |
| 2020/0296525 A1* | 9/2020 | Nyström | H04R 25/70 |
| 2021/0051425 A1* | 2/2021 | Holgersson | H04R 25/606 |
| 2021/0227329 A1* | 7/2021 | Ogata | H02N 2/04 |
| 2022/0073342 A1* | 3/2022 | Ho | H04R 19/04 |
| 2022/0116715 A1* | 4/2022 | Ho | H04R 31/003 |
| 2022/0286772 A1* | 9/2022 | Zhou | H04R 1/083 |

* cited by examiner

*Primary Examiner* — David J Bolduc
(74) *Attorney, Agent, or Firm* — W&G Law Group

(57) ABSTRACT

The present disclosure provides a bone-conduction sensor assembly. The bone-conduction sensor assembly includes a housing, a printed circuit board assembly forming a first receiving cavity together with the housing, a diaphragm accommodated in the first receiving cavity, a MEMS die and an ASIC chip mounted on the printed circuit board assembly. The MEMS die electrically connects to the ASIC chip through a bonding wire. A first weight is located on a surface of the diaphragm facing to the printed circuit board assembly. A position of the first weight has an avoiding portion corresponding to the bonding wire.

7 Claims, 2 Drawing Sheets

BONE-CONDUCTION SENSOR ASSEMBLY

FIELD OF THE PRESENT DISCLOSURE

The present disclosure relates to sensor, and more particularly, to a bone-conduction sensor assembly.

DESCRIPTION OF RELATED ART

Bone-conduction sensors are widely used in existing equipment. A general bone-conduction sensor usually includes a vibration generating part and a vibration detecting part. The vibration generating part transmits the vibration signal to the vibration detecting part, and the vibration detecting part detects the vibration signal and transfers it to electrical signal for transmission.

Vibration detecting part of the bone-conduction sensor in related art usually includes a MEMS die and ASIC chip electrically connected the MEMS die through a bonding wire. Vibration generating part may include a diaphragm and weight attached to the surface of the diaphragm. However, due to the small size of the bone-conduction sensor and the tight internal structures in the bone-conduction sensor, the setting of the weight will affect the setting of the bonding wire. When the bone-conduction sensor is working, the weight vibrates together with the diaphragm, and will easy to hit the bonding wire, which resulting adverse effects. For example, the bonding wire is easy to loose and fall off.

Therefore, it is desired to provide a new bone-conduction sensor which can overcome the aforesaid problems.

SUMMARY

In view of the above, the embodiments of the present disclosure provide a new bone-conduction sensor assembly. By the present disclosure, the bone-conduction sensor assembly has good stability.

The present disclosure provides a bone-conduction sensor assembly, and the bone-conduction sensor assembly includes a housing, a printed circuit board assembly forming a first receiving cavity together with the housing, a diaphragm accommodated in the first receiving cavity, a MEMS die and an ASIC chip mounted on the printed circuit board assembly. The MEMS die electrically connects to the ASIC chip through a bonding wire. A first weight is located on a surface of the diaphragm facing to the printed circuit board assembly. A position of the first weight having an avoiding portion corresponding to the bonding wire.

As an improvement, the first weight is a hollow annular structure.

As an improvement, the bone-conduction sensor assembly further comprises a second weight located on the surface facing away from the diaphragm.

As an improvement, the housing comprises an upper cover and a spacer fixed on the printed circuit board assembly, the diaphragm is sandwiched between the upper cover and the spacer.

As an improvement, the upper housing comprises a first portion extending horizontally and a second portion bending and extending from the first portion, the first portion provides a venting hole communicated with the first receiving cavity.

As an improvement, the printed circuit board assembly comprises a first printed circuit board fixed with the housing, a second printed circuit board spaced apart from the first printed circuit board, and third printed circuit board located between the first and second printed circuit board, the first, second, and third printed circuit boards cooperatively enclose a second receiving cavity, the MEMS die comprises a back chamber communicated with the second receiving cavity.

As an improvement, the first printed circuit board comprises a though hole, the second receiving cavity communicates to the back chamber of the MEMS die through the though hole.

BRIEF DESCRIPTION OF THE DRAWINGS

Many aspects of the exemplary embodiments can be better understood with reference to the following drawing. The components in the drawing are not necessarily drawn to scale, the emphasis instead being placed upon clearly illustrating the principles of the present disclosure. Moreover, in the drawings, like reference numerals designate corresponding parts throughout the several views.

DETAILED DESCRIPTION OF THE EXEMPLARY EMBODIMENTS

The present disclosure will hereinafter be described in detail with reference to exemplary embodiments. To make the technical problems to be solved, technical solutions and beneficial effects of the present disclosure more apparent, the present disclosure is described in further detail together with the figures and the embodiments. It should be understood the specific embodiments described hereby are only to explain the disclosure, not intended to limit the disclosure.

Figure 1:
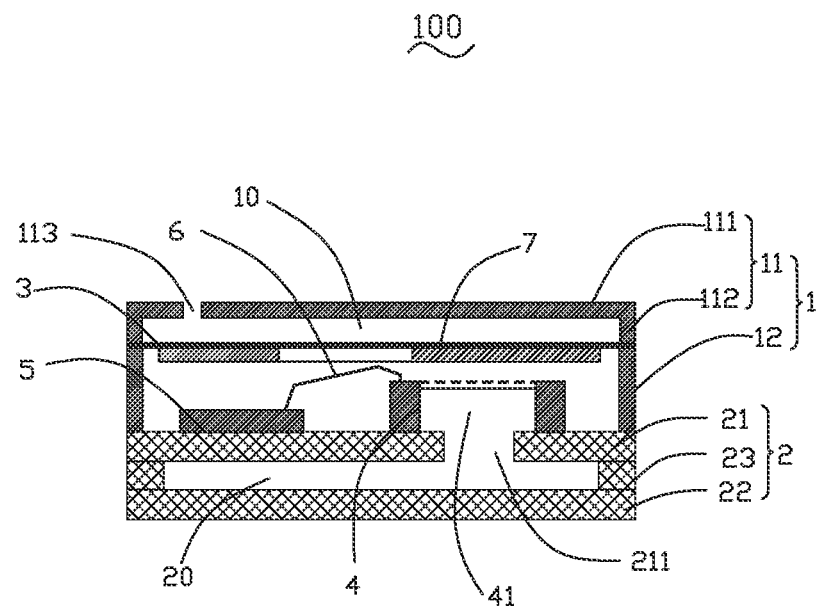
FIG. 1 is an illustrative cross-sectional view of the bone-conduction sensor assembly in accordance with a first embodiment of the present disclosure.
Figure 2:
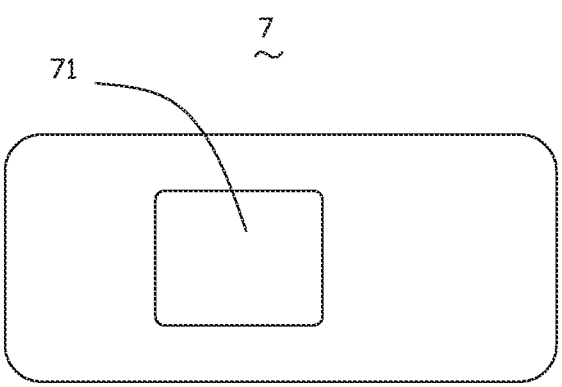
FIG. 2 is an illustrative isometric view of a weight of the bone-conduction sensor assembly.

Referring to the FIGS. 1-2, the present disclosure provides a first embodiment of a bone-conduction sensor assembly 100. The bone-conduction sensor assembly 100 comprises a housing 1, a printed circuit board assembly 2 forming a first receiving cavity 10 together with the housing, a diaphragm 3 accommodated in the first receiving cavity 10, a MEMS die 4 and an ASIC chip 5 mounted on the printed circuit board assembly 2, and a bonding wire 6 electrically connecting the MEMS die 4 to the ASIC chip 5.

The housing 1 comprises an upper cover 11 and a spacer 12 fixed on the printed circuit board assembly 2. The diaphragm 3 is sandwiched between the upper cover 11 and the spacer 12. The upper housing 11 comprises a first portion 111 extending horizontally and a second portion 112 bending and extending from the first portion 111. The first portion 111 provides a venting hole 113 communicated with the first receiving cavity 10.

The bone-conduction sensor assembly 100 further comprises a first weight 7 located on a surface of the diaphragm 3 facing to the printed circuit board assembly 2. The first weight 7 is a hollow annular structure. A position of the first weight 7 has an avoiding portion 71 corresponding to the bonding wire 6. The present disclosure does not limit the shape of the avoiding portion 71, as long as the avoiding portion 71 can successfully avoid the bonding wire 6, which can be circular, rectangular or other irregular shapes.

The printed circuit board assembly 2 comprises a first printed circuit board 21 fixed with the housing 1, a second printed circuit board 22 spaced apart from the first printed circuit board 21, and third printed circuit board 23 located between the first and second printed circuit board. The first, second, and third printed circuit boards cooperatively enclose a second receiving cavity 20. The first printed circuit board 21 comprises a though hole 211. The MEMS die 4 comprises a back chamber 41. The second receiving cavity 20 communicates to the back chamber 41 through the though hole 211.

When the bone-conduction sensor assembly 100 is working, the diaphragm 3 and the first weight 7 sense the vibration, which drives a gas in the first receiving cavity 10 to vibrate, and the air pressure changes, and the MEMS die 4 senses the vibration generated by the gas, and convert the sensed vibration signal into an electrical signal and transmit it to the printed circuit board assembly 2.

Figure 3:
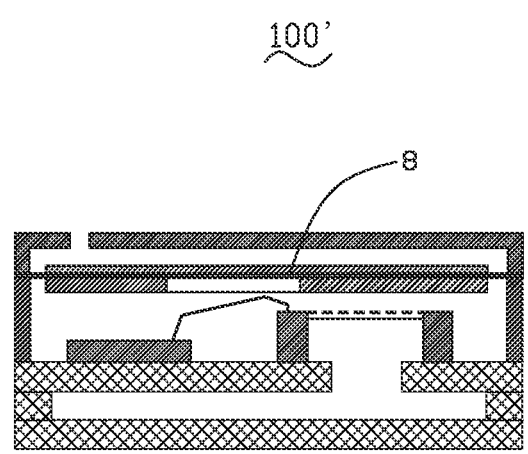
FIG. 3 is an illustrative cross-sectional view of the bone-conduction sensor assembly in accordance with a second embodiment of the present disclosure.

Also referring to the FIG. 3, which is a second embodiment of the present disclosure. Comparing to the first embodiment of the bone-conduction sensor assembly 100, the bone-conduction sensor assembly 100' provided by the second embodiment further comprises a second weight 8 located on the surface facing away from the diaphragm 3'. And other structures in second embodiment are the same as the structures in first embodiment. This embodiment further increases the weight of the weights and meets the higher requirement for performance.

Comparing with the existing technologies, in the bone-conduction sensor assembly of present disclosure, the surface of the diaphragm facing to the printed circuit board assembly provides the first weight, and the position of the first weight has an avoiding portion corresponding to the bonding wire. When the bone-conduction sensor assembly is working, the first weight can strengthen the vibration when the diaphragm senses the vibration, and the avoiding portion can avoid hitting the bonding wire which connecting the MEMS die and the ASIC chip. It improves the stability of the product. At the same time the present disclosure also provide the second weight on the other side of the diaphragm, which can further strengthen the vibration sensed by the diaphragm, thereby improving the performance of the bone-conduction sensor assembly.

It is to be understood, however, that even though numerous characteristics and advantages of the present exemplary embodiments have been set forth in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms where the appended claims are expressed.

What is claimed is:

1. A bone-conduction sensor assembly, comprising:
    a housing;
    a printed circuit board assembly forming a first receiving cavity together with the housing;
    a diaphragm accommodated in the first receiving cavity;
    a MEMS die and an ASIC chip mounted on the printed circuit board assembly, the MEMS die electrically connected to the ASIC chip through a bonding wire;
    a first weight located on a surface of the diaphragm facing to the printed circuit board assembly, a position of the first weight having an avoiding portion corresponding to the bonding wire.

2. The bone-conduction sensor assembly as described in claim 1, wherein the first weight is a hollow annular structure.

3. The bone-conduction sensor assembly as described in claim 1, wherein the bone-conduction sensor assembly further comprises a second weight located on the surface facing away from the diaphragm.

4. The bone-conduction sensor assembly as described in claim 1, wherein the housing comprises an upper cover and a spacer fixed on the printed circuit board assembly, the diaphragm is sandwiched between the upper cover and the spacer.

5. The bone-conduction sensor assembly as described in claim 4, wherein the upper housing comprises a first portion extending horizontally and a second portion bending and extending from the first portion, the first portion provides a venting hole communicated with the first receiving cavity.

6. The bone-conduction sensor assembly as described in claim 1, wherein the printed circuit board assembly comprises a first printed circuit board fixed with the housing, a second printed circuit board spaced apart from the first printed circuit board, and third printed circuit board located between the first and second printed circuit board, the first, second, and third printed circuit boards cooperatively enclose a second receiving cavity, the MEMS die comprises a back chamber communicated with the second receiving cavity.

7. The bone-conduction sensor assembly as described in claim 6, wherein the first printed circuit board comprises a though hole, the second receiving cavity communicates to the back chamber of the MEMS die through the though hole.

\* \* \* \* \*